US012685044B2

(12) United States Patent
Degai et al.

(10) Patent No.: US 12,685,044 B2
(45) Date of Patent: Jul. 14, 2026

(54) METHOD OF MANUFACTURING SEMICONDUCTOR DEVICE, METHOD OF PROCESSING SUBSTRATE, SUBSTRATE PROCESSING APPARATUS, AND RECORDING MEDIUM

(71) Applicant: Kokusai Electric Corporation, Tokyo (JP)

(72) Inventors: Motomu Degai, Toyama (JP); Kimihiko Nakatani, Toyama (JP); Takashi Nakagawa, Toyama (JP); Takayuki Waseda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 694 days.

(21) Appl. No.: 17/477,058

(22) Filed: Sep. 16, 2021

(65) Prior Publication Data

US 2022/0005685 A1 Jan. 6, 2022

Related U.S. Application Data

(63) Continuation of application No. PCT/JP2019/011772, filed on Mar. 20, 2019.

(51) Int. Cl.
*H01L 21/02* (2006.01)
*C23C 16/04* (2006.01)
(Continued)

(52) U.S. Cl.
CPC ........ *H10P 14/6339* (2026.01); *C23C 16/042* (2013.01); *C23C 16/52* (2013.01);
(Continued)

(58) Field of Classification Search
CPC ........... H01L 21/0228; H01L 21/02167; H01L 21/0217; H01L 21/02269; H01L 21/28562;
(Continued)

(56) References Cited

U.S. PATENT DOCUMENTS 4,902,645 A 2/1990 Ohba
6,013,575 A 1/2000 Itoh
(Continued)

FOREIGN PATENT DOCUMENTS

JP 02-000314 A 1/1990
JP 09-022896 A 1/1997
(Continued)

OTHER PUBLICATIONS

Khan et al., "Area-Selective Atomic Layer Deposition Using Si Precursors as Inhibitors," Chemical Materials 30 (2018) pp. 7603-7610.*

(Continued)

*Primary Examiner* — Jay C Kim

(74) *Attorney, Agent, or Firm* — Volpe Koenig

(57) ABSTRACT

There is provided a technique that includes: (a) supplying an adsorption suppressor to a substrate having a surface on which a first base and a second base are exposed under a first temperature to adsorb the adsorption suppressor on a surface of one base of the first base and the second base; (b) thermally annealing the substrate under a second temperature higher than the first temperature after adsorbing the adsorption suppressor on the surface of the one base; and (c) forming a film on a surface of the other base different from the one base of the first base and the second base by supplying a film-forming gas to the thermally-annealed substrate under a third temperature lower than the second temperature.

16 Claims, 8 Drawing Sheets

(51) Int. Cl.

| | |
|---|---|
| *C23C 16/52* | (2006.01) |
| *H10P 14/43* | (2026.01) |
| *H10P 14/60* | (2026.01) |
| *H10P 14/69* | (2026.01) |
| *H10P 14/694* | (2026.01) |

(52) U.S. Cl.

CPC ........ *H10P 14/432* (2026.01); *H10P 14/6332* (2026.01); *H10P 14/6905* (2026.01); *H10P 14/69433* (2026.01)

(58) Field of Classification Search

CPC ... C23C 16/042; C23C 16/52; C23C 16/0227; C23C 16/0272; C23C 16/04; C23C 16/34; C23C 16/45523; C23C 16/45527; C23C 16/46; H10P 14/6339; H10P 14/432; H10P 14/6332; H10P 14/6905; H10P 14/69433; H10P 14/412; H10P 14/60; H10P 14/69394; H10P 14/6512; H10P 72/0432; H10W 20/037

See application file for complete search history.

(56) References Cited

U.S. PATENT DOCUMENTS

| | | | | |
|---|---|---|---|---|
| 8,293,658 | B2 * | 10/2012 | Shero | C23C 16/45525 |
| | | | | 438/758 |
| 9,257,303 | B2 * | 2/2016 | Haukka | C23C 16/0227 |
| 9,911,595 | B1 * | 3/2018 | Smith | H01L 21/31138 |
| 10,014,212 | B2 * | 7/2018 | Chen | H01L 21/7685 |
| 10,043,656 | B1 * | 8/2018 | Smith | C23C 16/04 |
| 10,047,435 | B2 * | 8/2018 | Haukka | C23C 16/06 |
| 10,312,078 | B2 * | 6/2019 | Murakami | C23C 16/02 |
| 10,355,111 | B2 * | 7/2019 | Chui | H01L 29/66818 |
| 10,460,930 | B2 * | 10/2019 | Hausmann | H01L 21/02304 |
| 10,546,741 | B2 * | 1/2020 | Murakami | H01L 21/02164 |
| 10,847,363 | B2 * | 11/2020 | Tapily | H01L 21/76897 |
| 10,872,765 | B2 * | 12/2020 | Tois | H01L 21/32 |
| 10,900,120 | B2 * | 1/2021 | Sharma | H01L 21/02189 |
| 10,950,433 | B2 * | 3/2021 | Ke | H01L 21/02323 |
| 11,145,506 | B2 * | 10/2021 | Maes | H01L 21/67213 |
| 11,643,720 | B2 * | 5/2023 | Illiberi | C23C 16/45534 |
| | | | | 427/579 |
| 11,728,164 | B2 * | 8/2023 | Tois | C23C 16/04 |
| | | | | 438/786 |
| 11,823,909 | B2 * | 11/2023 | Sharma | H01L 21/76834 |
| 11,965,238 | B2 * | 4/2024 | Illiberi | C23C 16/45525 |
| 11,993,845 | B2 * | 5/2024 | Choi | C23C 16/04 |
| 12,024,770 | B2 * | 7/2024 | Ke | C23C 16/14 |
| 2009/0053893 | A1 * | 2/2009 | Khandelwal | H01L 21/28562 |
| | | | | 257/E21.17 |
| 2016/0247695 | A1 * | 8/2016 | Niskanen | H01L 21/02334 |
| 2017/0278705 | A1 | 9/2017 | Murakami et al. | |
| 2017/0342553 | A1 | 11/2017 | Yu et al. | |
| 2018/0094352 | A1 * | 4/2018 | Mane | H01L 21/76877 |
| 2018/0211833 | A1 * | 7/2018 | Li | H01L 21/0228 |
| 2018/0366317 | A1 * | 12/2018 | Ke | H01L 21/0228 |
| 2019/0157076 | A1 * | 5/2019 | Hausmann | C23C 16/50 |
| 2020/0020580 | A1 * | 1/2020 | Lee | H01L 21/0228 |
| 2021/0143001 | A1 * | 5/2021 | Ashihara | H01L 21/0206 |
| 2021/0358745 | A1 * | 11/2021 | Maes | H01L 21/02118 |

FOREIGN PATENT DOCUMENTS

| | | | |
|---|---|---|---|
| JP | 2013-243193 | A | 12/2013 |
| JP | 2015-514160 | A | 5/2015 |
| JP | 2017-222928 | A | 12/2017 |
| WO | 2013/148444 | A1 | 10/2013 |

OTHER PUBLICATIONS

Bobb-Semple et al., "Area-Selective Atomic Layer Deposition Assisted by Self-Assembled Monolayers: A Comparison of Cu, Co, W, and Ru," Chemical Materials 31 (2019) pp. 1635-1645.*

International Search Report, PCT/JP2019/011772, Jun. 18, 2019, 2 pgs.

Chinese Office Action issued on Jul. 26, 2023 for Chinese Patent Application No. 201980088596.6.

Korean Office Action issued on Sep. 19, 2023 for Korean Patent Application No. 10-2021-7030315.

Japanese Office Action issued on Jul. 12, 2022 for Japanese Patent Application No. 2021-506099.

Singapore Written Opinion issued on Sep. 28, 2022 for Singapore Patent Application No. 11202110268W.

* cited by examiner

FIG. 1

⬤ DMATMS (Chemical adsorption)

⬤ DMATMS (Chemical adsorption)

METHOD OF MANUFACTURING SEMICONDUCTOR DEVICE, METHOD OF PROCESSING SUBSTRATE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2019/011772, filed Mar. 20, 2019, the disclosure of which is incorporated herein in its entirety by reference.

TECHNICAL FIELD

The present disclosure relates to a method of manufacturing a semiconductor device, a method of processing a substrate, a substrate processing apparatus, and a recording medium.

BACKGROUND

In the related art, as a process of manufacturing a semiconductor device, a process of selectively growing and forming a film on a surface of a specific one base among a plurality of types of bases exposed on a surface of a substrate (this process is also hereinafter referred to as selective growth or selective film formation) may be carried out.

SUMMARY

Some embodiments of the present disclosure provide a technique capable of simplifying a process of manufacturing a semiconductor device.

According to embodiments of the present disclosure, there is provided a technique that includes: (a) supplying an adsorption suppressor to a substrate having a surface on which a first base and a second base are exposed under a first temperature to adsorb the adsorption suppressor on a surface of one base of the first base and the second base; (b) thermally annealing the substrate under a second temperature higher than the first temperature after adsorbing the adsorption suppressor on the surface of the one base; and (c) forming a film on a surface of the other base different from the one base of the first base and the second base by supplying a film-forming gas to the thermally-annealed substrate under a third temperature lower than the second temperature.

BRIEF DESCRIPTION OF DRAWINGS

The accompanying drawings, which are incorporated in and constitute a part of the specification, illustrate embodiments of the present disclosure.

FIG. 1 is a schematic configuration view of a vertical process furnace 202 of a substrate processing apparatus suitably used in embodiments of the present disclosure, in which a portion of the process furnace is shown in a vertical cross section.

FIGS. 6A to 6D are diagrams showing measurement results of thicknesses of titanium nitride films formed on the surfaces of the first to third bases exposed on the surface of the wafer respectively.

DETAILED DESCRIPTION

Embodiments of the Present Disclosure

Figure 2:
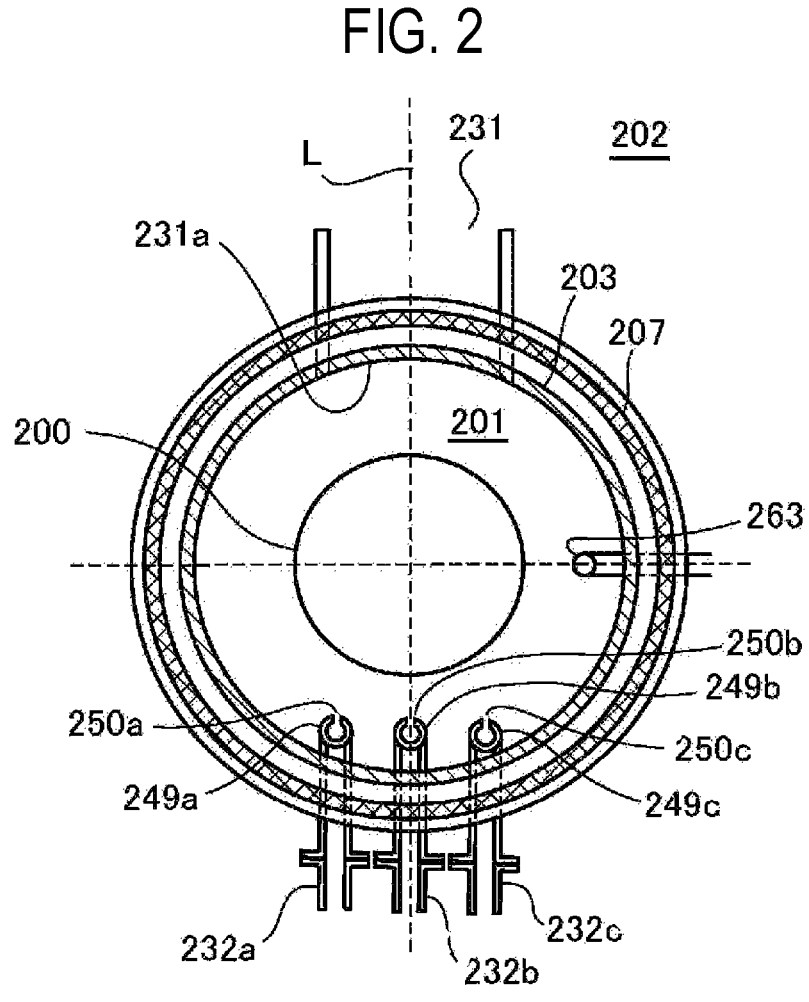
FIG. 2 is a schematic configuration view of a vertical process furnace 202 of the substrate processing apparatus suitably used in embodiments of the present disclosure, in which a portion of the process furnace is shown in a cross section taken along a line A-A in FIG. 1.

Embodiments of the present disclosure will be now described mainly with reference to FIGS. 1 to 4.

(1) Configuration of Substrate Processing Apparatus

Figure 1:
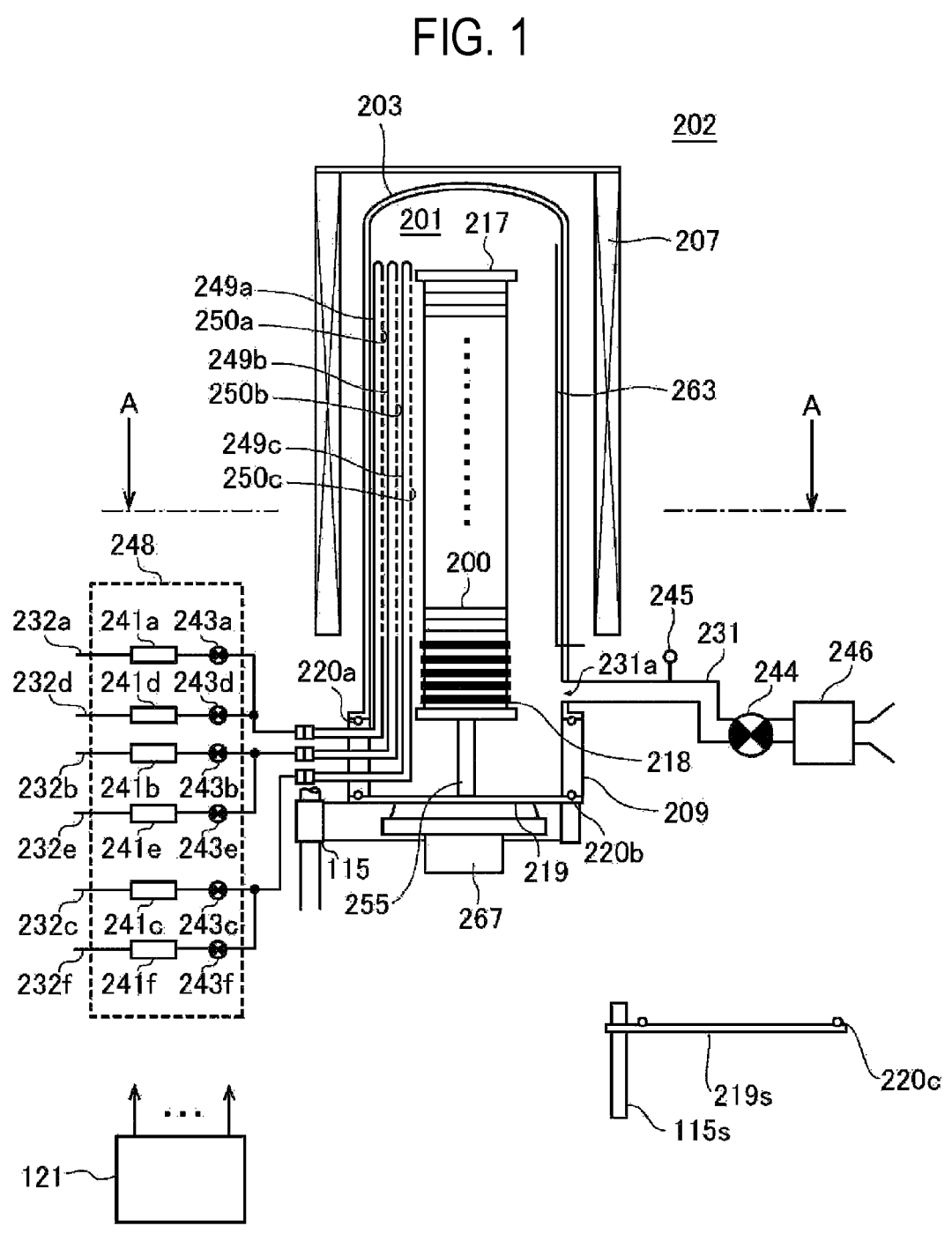

As shown in FIG. 1, a process furnace 202 includes a heater 207 as a heating mechanism (a temperature regulator). The heater 207 has a cylindrical shape and is supported by a support plate to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz (SiO$_2$) or silicon carbide (SiC), and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS), and has a cylindrical shape with both of its upper and lower ends opened. The upper end portion of the manifold 209 engages with the lower end portion of the reaction tube 203 to support the reaction tube 203. An O-ring 220a serving as a seal is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to be capable of accommodating wafers 200 as substrates. Processing on the wafers 200 is performed in the process chamber 201.

Nozzles 249a to 249c as first to third supply parts are installed in the process chamber 201 to penetrate through a sidewall of the manifold 209 respectively. The nozzles 249a to 249c are also referred to as first to third nozzles, respectively. The nozzles 249a to 249c are made of, for example, a heat resistant material such as quartz or SiC. Gas supply pipes 232a to 232c are connected to the nozzles 249a to 249c respectively. The nozzles 249a to 249c are different nozzles, and each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed at the gas supply pipes 232a to 232c, respectively, sequentially from the corresponding upstream sides of gas flow. Gas supply pipes 232d to 232f are connected to the gas supply pipes 232a to 232c at the downstream sides of the valves 243a to 243c, respectively. MFCs 241d to 241f and valves 243d to 243f are installed at the gas supply pipes 232d to 232f, respectively, sequentially from the corresponding upstream sides of gas flow. The gas supply pipes 232a to 232f are made of, for example, a metal material such as SUS.

As shown in FIG. 2, each of the nozzles 249a to 249c is disposed in an annular space (in a plane view) between an inner wall of the reaction tube 203 and the wafers 200 to extend upward along an arrangement direction of the wafers 200 from a lower portion to an upper portion of the inner wall of the reaction tube 203. Specifically, each of the nozzles 249a to 249c is installed in a region horizontally surrounding a wafer arrangement region in which the wafers 200 are arranged at a lateral side of the wafer arrangement region, along the wafer arrangement region. In the plane view, the nozzle 249b is disposed to face an exhaust port 231a to be described below on a straight line with centers of the wafers 200, which are loaded into the process chamber 201, interposed therebetween. The nozzles 249a and 249c are arranged to sandwich a straight line L passing through the centers of the nozzle 249b and the exhaust port 231a between both sides along the inner wall of the reaction tube 203 (an outer peripheral portion of the wafers 200). The straight line L is also a straight line passing through the centers of the nozzle 249b and the wafers 200. That is, it may be said that the nozzle 249c is installed on the side opposite to the nozzle 249a with the straight line L interposed therebetween. The nozzles 249a and 249c are arranged in line symmetry with the straight line L as the axis of symmetry. Gas supply holes 250a to 250c configured to supply a gas are formed on side surfaces of the nozzles 249a to 249c, respectively. Each of the gas supply holes 250a to 250c is opened to oppose (face) the exhaust port 231a in the plane view to allow the gas to be supplied toward the wafers 200. A plurality of gas supply holes 250a to 250c are formed from a lower portion to an upper portion of the reaction tube 203.

As a precursor gas, a gas containing titanium (Ti) as a main element forming a film formed on a wafer 200, and a halogen element, that is, a titanium halogenide gas, is supplied from the gas supply pipe 232a into the process chamber 201 via the MFC 241a, the valve 243a, and the nozzle 249a. The titanium halogenide gas acts as a film-forming gas, that is, a Ti source (precursor gas or precursor). The halogen element includes chlorine (Cl), fluorine (F), bromine (Br), iodine (I), and the like. As the titanium halogenide gas, it may be possible to use, for example, a tetrachlorotitanium (TiCl$_4$) gas which is a titanium chloride gas.

As an adsorption suppressor (adsorption inhibitor), an organic adsorption suppressor such as an organic silane compound is supplied from the gas supply pipe 232b into the process chamber 201 via the MFC 241b, the valve 243b, and the nozzle 249b. As organic adsorption suppressor, it may be possible to use, for example, a dimethylaminotrimethylsilane ((CH$_3$)$_2$NSi(CH$_3$)$_3$, abbreviation: DMATMS) gas which is an aminosilane compound.

As a reaction gas, a hydrogen nitride-based gas, which is a nitrogen (N)-containing gas, is supplied from the gas supply pipe 232c into the process chamber 201 via the MFC 241c, the valve 243c, and the nozzle 249c. The hydrogen nitride-based gas acts as a film-forming gas, that is, a N source (nitriding gas or nitriding agent). As the hydrogen nitride-based gas, it may be possible to use, for example, an ammonia (NH$_3$) gas.

As an inert gas, for example, a nitrogen (N$_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c, respectively. The N$_2$ gas acts as a purge gas, a carrier gas, a dilution gas, or the like.

A film-forming gas supply system (precursor gas supply system or reaction gas supply system) mainly includes the gas supply pipes 232a and 232c, the MFCs 241a and 241c, and the valves 243a and 243c. An adsorption suppressor supply system mainly includes the gas supply pipe 232b, the MFC 241b, and the valve 243b. An inert gas supply system mainly includes the gas supply pipes 232d to 232f, the MFCs 241d to 241f, and the valves 243d to 243f.

One or all of the above-described various supply systems may be configured as an integrated supply system 248 in which the valves 243a to 243f, the MFCs 241a to 241f, and so on are integrated. The integrated supply system 248 is connected to each of the gas supply pipes 232a to 232f, and configured such that operations of supplying various types of gases into the gas supply pipes 232a to 232f (that is, the opening/closing operation of the valves 243a to 243f, the flow rate regulation operation by the MFCs 241a to 241f, and the like) are controlled by a controller 121 to be described below. The integrated supply system 248 is configured as an integral-type or detachable-type integrated unit, and may be attached to and detached from the gas supply pipes 232a to 232f and the like on an integrated unit basis such that maintenance, replacement, extension, and the like of the integrated supply system 248 may be performed on an integrated unit basis.

The exhaust port 231a configured to exhaust an internal atmosphere of the process chamber 201 is installed below the sidewall of the reaction tube 203. As shown in FIG. 2, in the plane view, the exhaust port 231a is installed at a position opposing (facing) the nozzles 249a to 249c (the gas supply holes 250a to 250c) with the wafers 200 interposed therebetween. The exhaust port 231a may be installed from a lower portion to an upper portion of the sidewall of the reaction tube 203, that is, along the wafer arrangement region. An exhaust pipe 231 is connected to the exhaust port 231a. A vacuum pump 246 as a vacuum exhaust device is connected to the exhaust pipe 231 via a pressure sensor 245, which is a pressure detector (pressure regulation part) configured to detect an internal pressure of the process chamber 201, and an APC (Auto Pressure Controller) valve 244, which is a pressure regulator (pressure regulation part). The APC valve 244 is configured to be capable of performing or stopping a vacuum exhaust operation in the process chamber 201 by opening/closing the valve while the vacuum pump 246 is actuated, and is also configured to be capable of regulating the internal pressure of the process chamber 201 by adjusting an opening degree of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening lid configured to be capable of hermetically sealing a lower end opening of the manifold 209, is installed under the manifold 209. The seal cap 219 is made of, for example, a metal material such as stainless steel (SUS), and is formed in a disc shape. An O-ring 220b, which is a seal making contact with the lower end portion of the manifold 209, is installed on an upper surface of the seal cap 219. A rotation mechanism 267 configured to rotate a boat 217 to be described below, is installed under the seal cap 219. A rotary shaft 255 of the rotation mechanism 267 is connected to the boat 217 through the seal cap 219. The rotation mechanism 267 is configured to rotate the wafers 200 by rotating the boat 217. The seal cap 219 is configured to be vertically raised or lowered by a boat elevator 115 which is an elevating mechanism installed outside the reaction tube 203. The boat elevator 115 is configured as a transfer device (transfer mechanism) which loads/unloads (transfers) the wafers 200 into/out of the process chamber 201 by raising or lowering the seal cap 219. A shutter 219s, which serves as a furnace opening lid configured to be capable of hermetically sealing a lower end opening of the manifold 209 in a state where the seal cap 219 is lowered and the boat 217 is unloaded from the process chamber 201, is installed under the manifold 209. The shutter 219s is made of, for example, a metal material such as stainless steel (SUS), and is formed in a disc shape. An O-ring 220c, which is a seal making contact with the lower end portion of the manifold 209, is installed on an upper surface of the shutter 219s. The opening/closing operation (such as elevation operation, rotation operation, or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of, for example, a heat resistant material such as quartz or SiC. Heat insulating plates 218 made of, for example, a heat resistant material such as quartz or SiC, are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that an interior of the process chamber 201 has a desired temperature distribution. The temperature sensor 263 is installed along the inner wall of the reaction tube 203.

Figure 3:
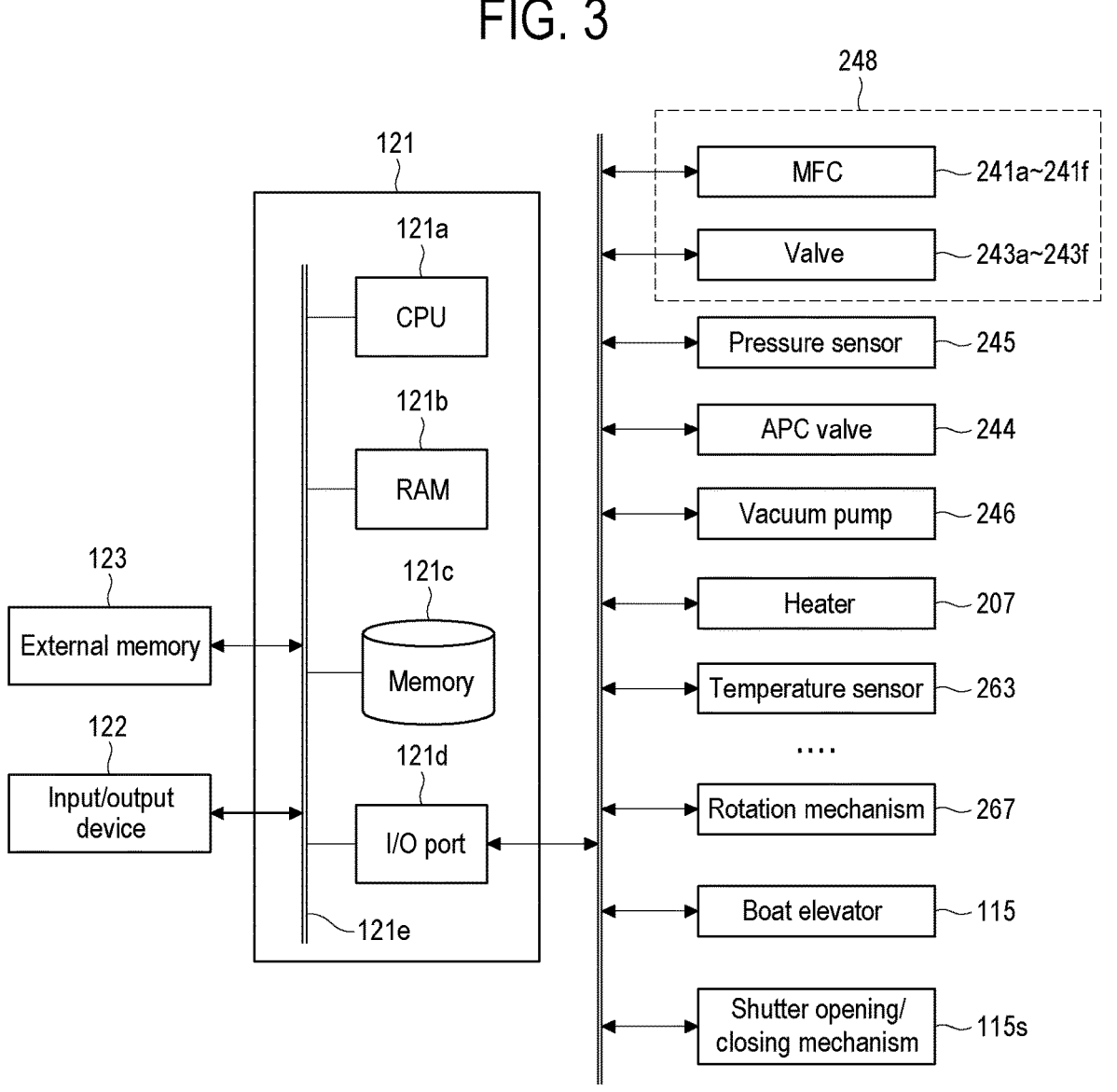
FIG. 3 is a schematic configuration diagram of a controller 121 of the substrate processing apparatus suitably used in embodiments of the present disclosure, in which a control system of the controller 121 is shown in a block diagram.

As shown in FIG. 3, a controller 121, which is a control part (control means), may be configured as a computer including a CPU (Central Processing Unit) 121a, a RAM (Random Access Memory) 121b, a memory 121c, and an I/O port 121d. The RAM 121b, the memory 121c, and the I/O port 121d are configured to be capable of exchanging data with the CPU 121a via an internal bus 121e. An input/output device 122 formed of, for example, a touch panel or the like, is connected to the controller 121.

The memory 121c includes, for example, a flash memory, a HDD (Hard Disk Drive), and the like. A control program that controls operations of a substrate processing apparatus, a process recipe in which sequences and conditions of substrate processing to be described below are written, and the like are readably stored in the memory 121c. The process recipe functions as a program configured to be capable of causing the controller 121 to execute each sequence in the substrate processing to be described below, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe alone, a case of including the control program alone, or a case of including both the recipe and the control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter opening/closing mechanism 115s, and the like.

The CPU 121a is configured to read and execute the control program from the memory 121c. The CPU 121a is also configured to read the recipe from the memory 121c according to an input of an operation command from the input/output device 122, and the like. In addition, the CPU 121a is configured to control the flow rate regulation operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the actuating and stopping operation of the vacuum pump 246, the temperature regulating operation performed by the heater 207 based on the temperature sensor 263, the operation of adjusting the rotation and the rotation speed of the boat 217 by the rotation mechanism 267, the operation of raising or lowering the boat 217 by the boat elevator 115, the opening/closing operation of the shutter 219s by the shutter opening/closing mechanism 115s, and the like, according to contents of the read recipe.

The controller 121 may be configured by installing, on the computer, the aforementioned program stored in an external memory 123. Examples of the external memory 123 may include a magnetic disk such as a HDD, an optical disc such as a CD, a magneto-optical disc such as a MO, a semiconductor memory such as a USB memory, and the like. The memory 121c or the external memory 123 is configured as a non-transitory computer-readable recording medium. Hereinafter, the memory 121c and the external memory 123 may be generally and simply referred to as a "recording medium." When the term "recording medium" is used herein, it may indicate a case of including the memory 121c alone, a case of including the external memory 123 alone, or a case of including both the memory 121c and the external memory 123. Furthermore, the program may be provided to the computer by using a communication means such as the Internet or a dedicated line, instead of using the external memory 123.

(2) Substrate Processing Process

As a process of manufacturing a semiconductor device by using the above-described substrate processing apparatus, a processing sequence example of selective growth (selective film formation) of selectively growing and forming a film on the surface of a specific one base among a plurality of types of bases exposed on the surface of a wafer 200 as a substrate will be described mainly with reference to FIGS. 4 and 5A to 5D. In the following descriptions, operations of the respective parts constituting the substrate processing apparatus are controlled by the controller 121.

Figure 4:
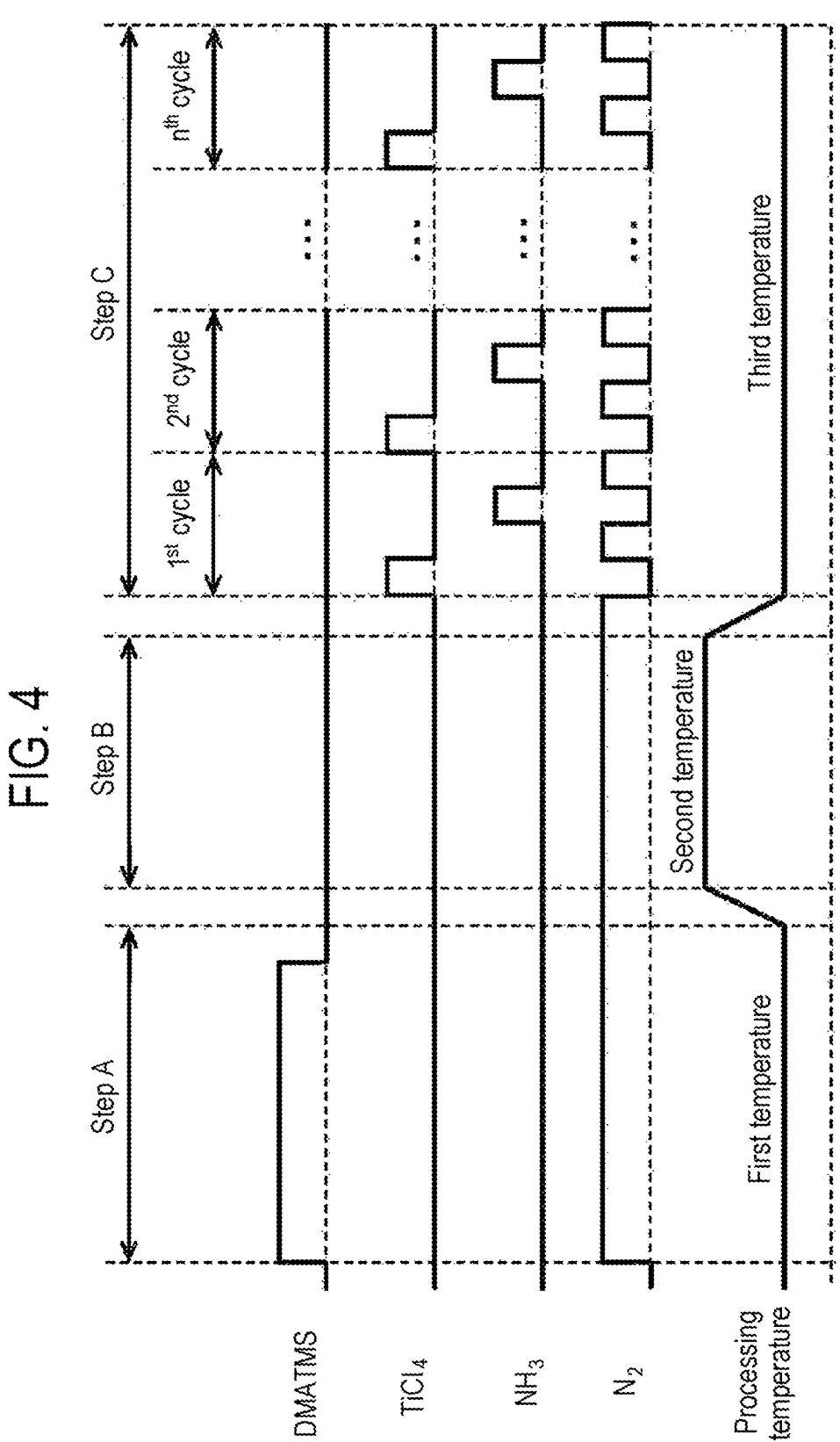
FIG. 4 is a diagram showing a processing sequence of selective growth according to embodiments of the present disclosure.

The film-forming sequence shown in FIG. 4 includes:

Step A of supplying a DMATMS gas as an adsorption suppressor to a wafer 200 having a surface on which a first base (base 200a) including a tungsten film (W film) and a second base (base 200b) including a silicon nitride film (SiN film) are exposed under a first temperature to adsorb the DMATMS gas on a surface of one base (here, the base 200b) of the base 200a and the base 200b;

Step B of thermally annealing the wafer 200 under a second temperature higher than the first temperature after adsorbing the DMATMS gas on the surface of the base 200b; and Step C of forming a titanium nitride film (TiN film), which is a film containing Ti and N, as a film on a surface of the other base (here, the base 200a) different from the one base of the base 200a and the base 200b by supplying a TiCl$_4$ gas and a NH$_3$ gas as film-forming gases to the thermally-annealed wafer 200 under a third temperature lower than the second temperature.

FIG. 4 shows a case where a cycle is performed a predetermined number of times (n time, where n is an integer of 1 or more) in Step C, the cycle including non-simultaneously performing Step C1 of supplying the TiCl$_4$ gas to the wafer 200 and Step C2 of supplying the NH$_3$ gas to the wafer 200. Further, FIGS. 5A to 5D show a case where in addition to the bases 200a and 200b, a third base (base 200c) including a silicon oxide film (SiO film) is further exposed on the surface of the wafer 200, the DMATMS is also adsorbed on the surface of the base 200c in Step A, the wafer 200 having the DMATMS adsorbed on the surfaces of the bases 200b and 200c is thermally annealed in Step B, and a TiN film is selectively formed on the surface of the base 200a without forming the TiN film on the surface of each of the bases 200b and 200c in Step C.

In the present disclosure, for the sake of convenience, the film-forming sequence shown in FIG. 4 may be denoted as follows. The same denotation may be used in other modifications and the like to be described below.

$$DMATMS \rightarrow ANL \rightarrow (TiCl_4 \rightarrow NH_3) \times n \Rightarrow TiN$$

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer and the like formed on a wafer." When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" is used in the present disclosure, it may be synonymous with the term "wafer."

(Wafer Charging and Boat Loading)

When a plurality of wafers 200 are charged in the boat 217 (wafer charging), the shutter 219s is moved by the shutter opening/closing mechanism 115s to open the lower end opening of the manifold 209 (shutter opening). Thereafter, as shown in FIG. 1, the boat 217 holding the plurality of wafers 200 is lifted up by the boat elevator 115 to be loaded into the process chamber 201 (boat loading). In this state, the seal cap 219 seals the lower end of the manifold 209 via the O-ring 220b.

Figures 5A, 5B:
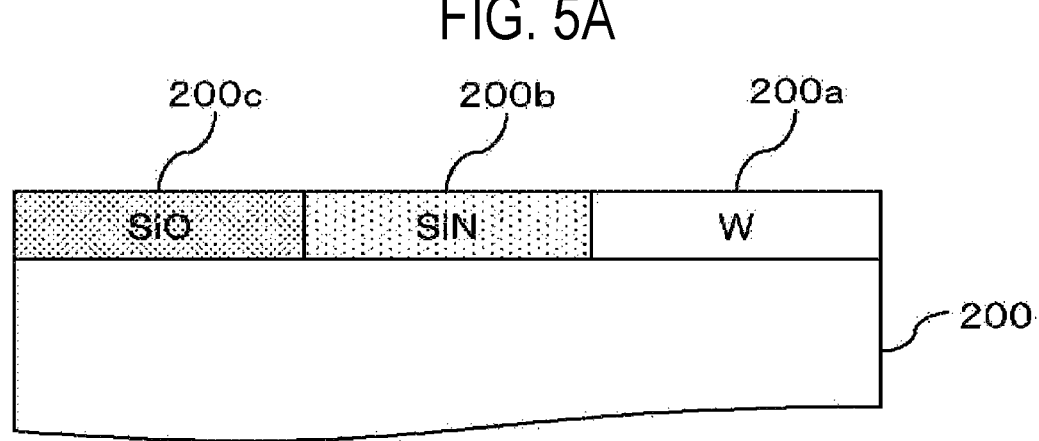
FIG. 5A is a partially-enlarged cross-sectional view of a surface of a wafer 200 on which a base 200a including a tungsten film, a base 200b including a silicon nitride film, and a base 200c including a silicon oxide film are exposed respectively.
FIG. 5B is a partially-enlarged cross-sectional view of the surface of the wafer 200 after an adsorption suppressor is selectively adsorbed on the surfaces of the bases 200b and 200c under a first temperature.

As shown in FIG. 5A, a plurality of types of bases, here, as an example, a base 200a including a W film as a transition metal-containing film, which is an O-free and metal element-containing film (non-oxide film), a base 200b including a SiN film as a nitride film which is an O-free and semi-metal element-containing film (non-oxide film), and a base 200c including a SiO film as an O-containing and semi-metal element-containing film, which is an O-containing film (oxide film), are exposed in advance on the surface of the wafer 200. The surface of the wafer 200 is, in advance, subjected to cleaning treatment by using an aqueous hydrogen fluoride (HF) solution to remove a natural oxide film formed on the surface of each base exposed on the surface of the wafer 200. The base 200c has a surface terminated with a hydroxyl group (OH) over the entire area (entire surface). The bases 200a and 200b have a surface not terminated with OH in many areas, that is, a surface terminated with OH in some areas. The OH termination rate on the surface of the base 200a tends to be smaller than the OH termination rate on the surface of the base 200b. The W film constituting the base 200a is a conductive film, and the SiN film constituting the base 200b and the SiO film constituting the base 200c are non-conductive films, that is, insulating films, respectively.

(Pressure Regulation and Temperature Regulation)

The interior of the process chamber 201, that is, a space where the wafer 200 is placed, is vacuum-exhausted (decompression-exhausted) by the vacuum pump 246 to reach a desired pressure (vacuum degree). At this time, the internal pressure of the process chamber 201 is measured by the pressure sensor 245, and the APC valve 244 is feedback-controlled based on the measured pressure information. Further, the wafer 200 in the process chamber 201 is heated by the heater 207 to have a desired temperature. At this time, the state of supplying electric power to the heater 207 is feedback-controlled based on the temperature information detected by the temperature sensor 263 such that the interior of the process chamber 201 has a desired temperature distribution. Further, the rotation of the wafers 200 by the rotation mechanism 267 is started. The exhaust of the interior of the process chamber 201 and the heating and rotation of the wafers 200 are continuously performed at least until the processing to the wafers 200 is completed.

(Selective Growth)

Thereafter, the next Steps A to C are sequentially executed.

[Step A]

In this step, under a first temperature, a DMATMS gas is supplied to the wafer 200 in the process chamber 201, that is, the wafer 200 having the surface on which the bases 200a to 200c are exposed.

Specifically, the valve 243b is opened to allow the DMATMS gas to flow into the gas supply pipe 232b. The flow rate of the DMATMS gas is regulated by the MFC 241b, and the DMATMS gas is supplied into the process chamber 201 via the nozzle 249b and is exhausted via the exhaust port 231a. In this operation, the DMATMS gas is supplied to the wafer 200 (DMATMS gas supply). At this time, the valves 243d and 243f are opened to allow a N$_2$ gas to be supplied into the process chamber 201 via the nozzles 249a and 249c, respectively. The supply of the N$_2$ gas may not be performed.

A process condition in this step is exemplified as follows.
DMATMS gas supply flow rate: 50 to 1,000 sccm, specifically 50 to 500 sccm
DMATMS gas supply time: 1 to 60 minutes, specifically 10 to 30 minutes N$_2$ gas supply flow rate (for each gas supply pipe): 0 to 10,000 sccm Processing temperature (first temperature): 50 to 300 degrees C., specifically 80 to 200 degrees C.

Processing pressure: 10 to 1,000 Pa, specifically 100 to 500 Pa

The condition described here is a condition in which the DMATMS gas does not undergo gas phase decomposition (thermal decomposition) in the process chamber 201.

In the present disclosure, a notation of a numerical range such as "50 to 300 degrees C." means that a lower limit value and an upper limit value are included in the range. Therefore, for example, "50 to 300 degrees C." means "50 degrees C. or higher and 300 degrees C. or lower." The same applies to other numerical ranges.

By supplying the DMATMS gas to the wafer 200 under the above-mentioned condition, as shown in FIG. 5B, it is possible to selectively (preferentially) adsorb DMATMS on the surfaces of the bases 200b and 200c while suppressing adsorption of DMATMS on the surface of the base 200a. At this time, DMATMS may be adsorbed on a portion of the surface of the base 200a, but an amount of adsorption thereof is small and the amounts of DMATMS adsorbed on the surfaces of the bases 200b and 200c are overwhelmingly large. When the amounts of DMATMS adsorbed on the surfaces of the bases 200b and 200c are compared, the amount of DMATMS adsorbed on the surface of the base 200c tends to be larger than the amount of DMATMS adsorbed on the surface of the base 200b.

Such selective adsorption is possible because the process condition in this step is a condition in which the DMATMS gas does not undergo gas phase decomposition in the process chamber 201. Further, this is possible because while the surface of the base 200c is OH-terminated over the entire area, the surfaces of the bases 200a and 200b are not OH-terminated in many areas (the surfaces thereof are OH-terminated in some areas). Further, this is possible because an OH termination rate on the surface of the base 200a tends to be smaller than an OH termination rate on the surface of the base 200b. Further, this is possible because while the W film constituting the base 200a is a conductive film, each of the SiN film constituting the base 200b and the SiO film constituting the base 200c is a non-conductive film (insulating film).

Specifically, although DMATMS may be very slightly physically adsorbed on the surface of the base 200a, this adsorption state becomes extremely unstable physical adsorption unlike the physical adsorption on the surface of the base 200b to be described below. As a result, DMATMS is not adsorbed at all on the surface of the base 200a, or even though it is adsorbed, an amount of adsorption thereof is very small, and the adsorption becomes a temporary phenomenon that is released in a very short time. It is presumed that the adsorption state of DMATMS on the surface of the base 200a becomes extremely unstable because the W film constituting the base 200a has conductivity such that the adsorption state of DMATMS on the surface of the base 200a becomes physical adsorption without charging.

Further, DMATMS is mainly physically adsorbed on the surface of the base 200b. This adsorption state is physical adsorption more stable than the physical adsorption of DMATMS on the surface of the base 200a. It is presumed that the adsorption state of DMATMS on the surface of the base 200b becomes more stable than the adsorption state of DMATMS on the surface of the base 200a is because the SiN film constituting the base 200b does not have conductivity (has insulation) such that the adsorption state of DMATMS on the surface of the base 200b becomes physical adsorption with weak charging. However, at the time of ending Step A, that is, at the time before Step B to be described below is performed, the adsorption state of DMATMS on the surface of the base 200b becomes an adsorption more unstable than the chemical adsorption of DMATMS on the surface of the base 200c to be described below. DMATMS is mainly physically adsorbed on the surface of the base 200b, but DMATMS may be partially chemically adsorbed on the surface of the base 200b. However, even in that case, the amount of chemical adsorption thereof is much smaller than the amount of chemical adsorption of DMATMS on the surface of the base 200c to be described below.

In addition, DMATMS is mainly chemically adsorbed on the surface of the base 200c. Specifically, the OH termination formed on the entire surface of the base 200c reacts with the DMATMS, and as a result, Si contained in DMATMS is chemically adsorbed on the surface of the base 200c. The adsorption state of DMATMS on the surface of the base 200c is more stable than the physical adsorption of DMATMS on the surface of the base 200b. Further, when Si contained in DMATMS is chemically adsorbed on the surface of the base 200c, most of ligands bonded to Si contained in DMATMS are maintained, but some of the ligands are desorbed. In the present disclosure, such DMATMS from which some of the ligands are desorbed during chemical adsorption is also referred to as DMATMS for the sake of convenience.

When the first temperature is lower than 50 degrees C., DMATMS is less likely to be adsorbed not only on the surface of the base 200a but also on the surfaces of the bases 200b and 200c. By setting the first temperature to a temperature of 50 degrees C. or higher, it is possible to adsorb DMATMS on the surfaces of the bases 200b and 200c. By setting the first temperature to a temperature of 80 degrees C. or higher, it is possible to promote the adsorption of DMATMS on the surfaces of the bases 200b and 200c.

Further, if the first temperature exceeds 300 degrees C., a thermal energy given to the reaction system exceeds the activation energy for DMATMS to be chemically adsorbed on the surfaces, such that DMATMS may also be adsorbed on not only the surfaces of the bases 200b and 200c but also the surface of the base 200a. Further, when the first temperature exceeds 300 degrees C., DMATMS may undergo vapor phase decomposition such that the constituent components and constituent elements (Si, an amino group, and a methyl group, or elements such as N, C, and H that constitute them)) of DMATMS may be multi-deposited on the respective surfaces of the bases 200a, 200b, and 200c. By setting the first temperature to a temperature of 300 degrees C. or lower, the adsorption of DMATMS and the multi-deposition of the constituent components and constituent elements of DMATMS on the surface of the base 200a are suppressed, such that DMATMS may be selectively and appropriately adsorbed on the surfaces of the bases 200b and 200c. By setting the first temperature to 200 degrees C. or lower, the adsorption of DMATMS and the multi-deposition of the constituent components and constituent elements of DMATMS on the surface of the base 200a are reliably suppressed, such that DMATMS may be is selectively and more appropriately adsorbed on the surfaces of the bases 200b and 200c.

When the supply of the DMATMS gas is continued for a predetermined time under the above-mentioned conditions, the adsorption of DMATMS on the surfaces of the bases 200*b* and 200*c* is saturated. That is, a self-limit is applied to the adsorption of DMATMS on the surfaces of the bases 200*b* and 200*c*. As a result, the amount of DMATMS adsorbed on the surfaces of the bases 200*b* and 200*c* becomes substantially a uniform amount over the entire surface of the bases 200*b* and 200*c*.

After DMATMS is selectively adsorbed on the surfaces of the bases 200*b* and 200*c*, the valve 243*a* is closed to stop the supply of DMATMS into the process chamber 201. Then, a gas and the like remaining in the process chamber 201 is removed from the process chamber 201. At this time, the valves 243*d* to 243*f* are opened to allow a N₂ gas to be supplied into the process chamber 201 via the nozzles 249*a* to 249*c*. The N₂ gas supplied from the nozzles 249*a* to 249*c* acts as a purge gas, whereby the interior of the process chamber 201 is purged (purging).

As the adsorption suppressor, in addition to the DMATMS gas, it may be possible to use, for example, an aminosilane compound represented by the following chemical formula [1].

$$SiA_x[(NB_2)_{(4-x)}] \qquad [1]$$

In the chemical formula [1], A represents a hydrogen atom, an alkyl group such as a methyl group, an ethyl group, a propyl group, or a butyl group, or an alkoxy group such as a methoxy group, an ethoxy group, a propoxy group, or a butoxy group. The alkyl group may be not only a linear alkyl group but also a branched alkyl group such as an isopropyl group, an isobutyl group, a secondary butyl group, or a tertiary butyl group. The alkoxy group may be not only a linear alkoxy group but also a branched alkoxy group such as an isopropoxy group or an isobutoxy group. B represents a hydrogen atom or an alkyl group such as a methyl group, an ethyl group, a propyl group, or a butyl group. The alkyl group may be not only a linear alkyl group but also a branched alkyl group such as an isopropyl group, an isobutyl group, a secondary butyl group, or a tertiary butyl group. The plurality of A's may be the same or different, and the two B's may be the same or different, and x is an integer of 1 to 3.

As the inert gas, in addition to the N₂ gas, it may be possible to use, for example, a rare gas such as an Ar gas, a He gas, a Ne gas, or a Xe gas. The same applies to each step to be described below.

[Step B]

In this step, an output of the heater 207 is regulated so that the wafer 200 after adsorbing DMATMS on the surfaces of the bases 200*b* and 200*c* is thermally annealed under a second temperature higher than the first temperature. This step may be performed in a state where the valves 243*d* to 243*f* are opened to allow a N₂ gas to be supplied into the process chamber 201, or in a state where the valves 243*d* to 243*f* are closed to stop the supply of the N₂ gas into the process chamber 201.

A process condition in this step is exemplified as follows.

N₂ gas supply flow rate (for each gas supply pipe): 0 to 1,000 sccm, specifically 50 to 500 sccm Processing temperature (second temperature): 400 to 600 degrees C., specifically 450 to 550 degrees C.

Processing pressure: 1 to 1,000 Pa, specifically 100 to 500 Pa

Processing time: 1 minute to 12 hours, specifically 1 to 5 hours

Figures 5C, 5D:
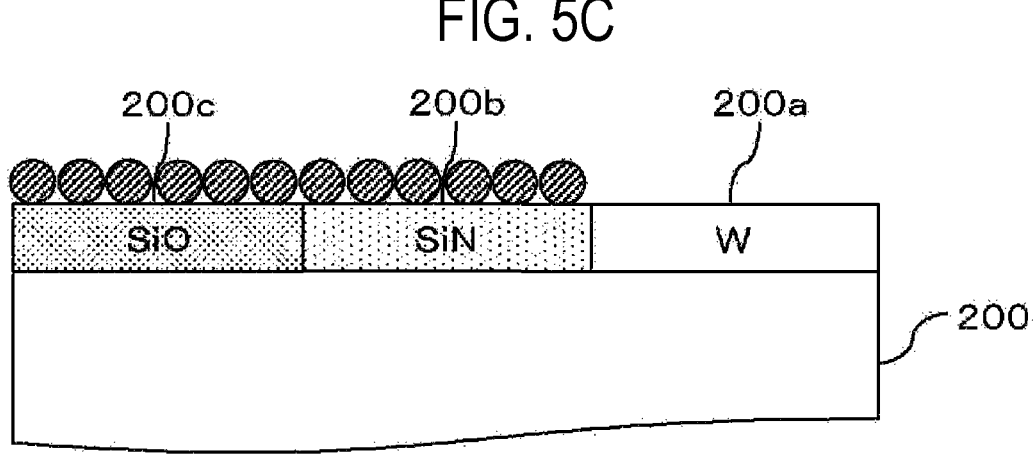
FIG. 5C is a partially-enlarged cross-sectional view of the surface of the wafer 200 after the wafer 200 having the adsorption suppressor adsorbed on the surfaces of the bases 200b and 200c is thermally annealed under a second temperature higher than the first temperature.
FIG. 5D is a partially-enlarged cross-sectional view of the surface of the wafer 200 after a titanium nitride film is selectively adsorbed on the surface of the base 200a under a third temperature lower than the second temperature.

By thermally annealing the wafer 200 under the above-mentioned condition, it is possible to shift (change) the adsorption state of DMATMS, which has been physically adsorbed on the surface of the base 200*b*, from physical adsorption to chemical adsorption. As a result, as shown in FIG. 5C, it is possible to change the adsorption state of DMATMS on the surface of the base 200*b* to an adsorption state more stable than the adsorption state of DMATMS on the surface of the base 200*b* in Step A. In this way, the surface of the base 200*b* is modified by performing Steps A and B, that is, through two-step processes. In a case where DMATMS is partially chemically adsorbed on the surface of the base 200*b*, even when this step is performed, the adsorption state of the chemically adsorbed component remains chemically adsorbed, that is, at a stable adsorption state as it is. Further, even when this step is performed, the adsorption state of DMATMS on the surface of the base 200*c* remains chemically adsorbed, that is, at a stable adsorption state as it is. That is, the modification of the surface of the base 200*c* is almost completed by performing Step A, that is, by one-step process. Further, even when this step is performed, the surface of the base 200*a* is maintained in a state where DMATMS is not adsorbed, that is, in a state where it is not modified.

When the second temperature is lower than 400 degrees C., the surface of the base 200*b* is not sufficiently modified, such that DMATMS may be desorbed from the surface of the base 200*b* in step C to be described below. By setting the second temperature to a temperature of 400 degrees C. or higher, it is possible to sufficiently modify the surface of the base 200*b*, such that the desorption of DMATMS from the surface of the base 200*b* may be suppressed in Step C to be described below. By setting the second temperature to 450 degrees C. or higher, it is possible to reliably modify the surface of the base 200*b*, such that the desorption of DMATMS from the surface of the base 200*b* in step C may be reliably suppressed.

Further, when the second temperature exceeds 600 degrees C., DMATMS adsorbed on the surfaces of the bases 200*b* and 200*c* may be decomposed, such that most of the ligands bonded to Si contained in DMATMS may be desorbed. When most of the ligands bonded to Si contained in DMATMS are desorbed, the effect of inhibiting film formation on the surfaces of the bases 200*b* and 200*c* may not be obtained in step C to be described below. By setting the second temperature to 600 degrees C. or lower, it is possible to suppress the desorption of the ligands due to the decomposition of DMATMS adsorbed on the surfaces of the bases 200*b* and 200*c*. By setting the second temperature to 550 degrees C. or lower, it is possible to reliably suppress the desorption of the ligands due to the decomposition of DMATMS adsorbed on the surfaces of the bases 200*b* and 200*c*.

After the modification of the surface of the base 200*b* is completed, the output of the heater 207 is regulated to lower the internal temperature of the process chamber 201 to a third temperature lower than the second temperature. At this time, a gas and the like remaining in the process chamber 201 is removed from the process chamber 201 (purging) according to the same processing procedures as in the purging in Step A.

[Step C]

In this step, Steps C1 and C2 are sequentially executed.

[Step C1]

In this step, a TiCl₄ gas is supplied to the wafer 200 in the process chamber 201, that is, the thermally-annealed wafer 200.

Specifically, the valve 243*a* is opened to allow the TiCl₄ gas to flow into the gas supply pipe 232*a*. The flow rate of the TiCl₄ gas is regulated by the MFC 241*a*, and the TiCl₄ gas is supplied into the process chamber 201 via the nozzle 249a and is exhausted through the exhaust port 231a. In this operation, the TiCl$_4$ gas is supplied to the wafer 200 (TiCl$_4$ gas supply). At this time, the valves 243e and 243f may be opened to allow a N$_2$ gas to be supplied into the process chamber 201 via the nozzles 249b and 249c, respectively.

A process condition in this step is exemplified as follows.

TiCl$_4$ gas supply flow rate: 1 to 1,000 sccm, specifically 10 to 500 sccm

TiCl$_4$ gas supply time: 1 to 60 seconds, specifically 2 to 10 seconds

Processing temperature (third temperature): 50 to 250 degrees C., specifically 150 to 200 degrees C.

Processing pressure: 1 to 500 Pa, specifically 10 to 100 Pa

Other process conditions are the same as those in Step A.

By supplying the TiCl$_4$ gas to the wafer 200 under the above-mentioned condition, a Ti-containing layer containing Cl is formed on the surface of the base 200a on which DMATMS is not adsorbed, of the bases 200a to 200c. The Ti-containing layer containing Cl is formed by chemical adsorption or physical adsorption of TiCl$_4$, chemical adsorption of a substance (TiCl$_x$) obtained by decomposing a portion of TiCl$_4$, deposition of Ti by thermal decomposition of TiCl$_4$, and the like on the surface of the base 200a. The Ti-containing layer containing Cl may be an adsorption layer (physical adsorption layer or chemical adsorption layer) of TiCl$_4$ or TiCl$_x$, or may be a Ti-deposited layer containing Cl. In the present disclosure, the Ti-containing layer containing Cl is also simply referred to as a Ti-containing layer.

In this step, it is possible to selectively form the Ti-containing layer on the surface of the base 200a while suppressing the formation of the Ti-containing layer on the surfaces of the bases 200b and 200c. When DMATMS is not sufficiently adsorbed on the surfaces of the bases 200b and 200c for some reason, a very slight Ti-containing layer may be formed on the surfaces of the bases 200b and 200c. Even in this case, the thickness of the Ti-containing layer formed on the surfaces of the bases 200b and 200c is much thinner than the thickness of the Ti-containing layer formed on the surface of the bases 200a. Such selective formation of the Ti-containing layer is possible because DMATMS existing on the surfaces of the bases 200b and 200c acts as a factor that inhibits the formation of the Ti-containing layer (adsorption of Ti) on the surfaces of the bases 200b and 200c, that is, an inhibitor. On the surfaces of the bases 200b and 200c, it is possible to prolong a time until film formation reaction occurs, that is, an incubation time, by the above-mentioned action of DMATMS, and as a result, it is possible to selectively form the Ti-containing layer on the surface of the base 200a of the bases 200a to 200c exposed on the surface of the wafer 200. DMATMS chemically adsorbed on the surfaces of the bases 200b and 200c is stably maintained without being desorbed even when this step is performed.

After the Ti-containing layer is formed on the surface of the base 200a, the valve 243a is closed to stop the supply of the TiCl$_4$ gas into the process chamber 201. Then, a gas and the like remaining in the process chamber 201 is removed from the process chamber 201 (purging) according to the same processing procedure as in the purging in Step A.

As a precursor gas (film-forming gas), in addition to a chlorotitanium-based gas such as the TiCl$_4$ gas, it may be possible to use a bromotitanium-based gas such as a tetrabromotitanium (TiBr$_4$) gas, or an iodotitanium-based gas such as a tetraiodotitanium (TiI$_4$) gas.

[Step C2]

In this step, a NH$_3$ gas is supplied to the wafer 200 in the process chamber 201, that is, to the Ti-containing layer formed on the base 200a.

Specifically, the valve 243c is opened to allow the NH$_3$ gas to flow into the gas supply pipe 232c. The flow rate of the NH$_3$ gas is regulated by the MFC 241c, and the NH$_3$ gas is supplied into the process chamber 201 via the nozzle 249c and is exhausted via the exhaust port 231a. In this operation, the NH$_3$ gas is supplied to the wafer 200 (NH$_3$ gas supply). At this time, the valves 243d and 243e may be opened to allow a N$_2$ gas to be supplied into the process chamber 201 via the nozzles 249a and 249b, respectively.

A process condition in this step is exemplified as follows.

NH$_3$ gas supply flow rate: 100 to 2,000 sccm, specifically 500 to 1,000 sccm

NH$_3$ gas supply time: 10 to 200 seconds, specifically 20 to 120 seconds

Processing pressure: 1 to 1000 Pa, specifically 50 to 500 Pa

Other process conditions are the same as the process conditions in step C1.

By supplying the NH$_3$ gas to the wafer 200 under the above-mentioned condition, at least a portion of the Ti-containing layer formed on the surface of the base 200a is nitrided (modified). As the Ti-containing layer is modified, a layer containing Ti and N, that is, a titanium nitride layer (TiN layer), is formed on the surface of the base 200a. When the TiN layer is formed, impurities such as Cl contained in the Ti-containing layer form a gaseous substance containing at least Cl in the process of modification reaction of the Ti-containing layer by the NH$_3$ gas and are discharged from the process chamber 201. As a result, the TiN layer becomes a layer having fewer impurities such as Cl than the Ti-containing layer formed in Step C1. DMATMS existing on the surfaces of the bases 200b and 200c is maintained without being desorbed even when this step is performed. That is, the surfaces of the bases 200b and 200c are stably maintained in a state in which DMATMS is adsorbed without being modified (NH-terminated).

After the TiN layer is formed on the surface of the base 200a, the valve 243c is closed to stop the supply of the NH$_3$ gas into the process chamber 201. Then, a gas and the like remaining in the process chamber 201 is removed from the process chamber 201 (purging) according to the same processing procedure as in the purging in Step A.

As a reaction gas (film-forming gas), in addition to the NH$_3$ gas, it may be possible to use, for example, a hydrogen nitride-based gas such as a diazene (N$_2$H$_2$) gas, a hydrazine (N$_2$H$_4$) gas, or a N$_3$H$_8$ gas.

[Performing Predetermined Number of Times]

By performing a cycle a predetermined number of times (n times, where n is an integer of 1 or more), the cycle including non-simultaneously, that is, without synchronization, performing the above-described steps C1 and C2, a TiN film may be selectively formed on the surface of the base 200a of the bases 200a to 200c exposed on the surface of the wafer 200, as shown in FIG. 5D. The above-described cycle may be performed a plurality of times. That is, the thickness of the TiN layer formed per cycle is made smaller than a desired film thickness, and the above-described cycle may be performed a plurality of times until the film thickness of a film formed by laminating the TiN layers reaches the desired film thickness.

When Steps C1 and C2 are performed, since DMATMS adsorbed on the surfaces of the bases 200b and 200c is maintained without being desorbed, no TiN film is formed on the surfaces of the bases 200b and 200c. However, when DMATMS is insufficiently adsorbed on the surfaces of the bases 200b and 200c for some reason, a very slight TiN film may be formed on the surfaces of the bases 200b and 200c.

Even in this case, the thickness of the TiN film formed on the surfaces of the bases 200*b* and 200*c* is much larger than the thickness of the TiN film formed on the surface of the bases 200*a*. In the present disclosure, "selectively forming the TiN film on the surface of the base 200*a*" of the bases 200*a* to 200*c* includes not only a case where no TiN film is formed on the surfaces of the bases 200*b* and 200*c* but also a case where a very thin TiN film is formed on the surfaces of the bases 200*b* and 200*c* as described above.

(After-Purge and Returning to Atmospheric Pressure)

After the selective formation of the TiN film on the surface of the base 200*a* is completed, a $N_2$ gas as a purge gas is supplied into the process chamber 201 from each of the nozzles 249*a* to 249*c* and is exhausted through the exhaust port 231*a*. Thus, the interior of the process chamber 201 is purged to remove a gas, reaction by-products and the like remaining in the process chamber 201 from the process chamber 201 (after-purge). Thereafter, the internal atmosphere of the process chamber 201 is substituted with an inert gas (inert gas substitution) and the internal pressure of the process chamber 201 is returned to the atmospheric pressure (returning to atmospheric pressure).

(Boat Unloading and Wafer Discharging)

After the internal pressure of the process chamber 201 is returned to the atmospheric pressure, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat is unloaded, the shutter 219*s* is moved and the lower end opening of the manifold 209 is sealed by the shutter 219*s* via the O-ring 220*c* (shutter closing). After being unloaded from the reaction tube 203, the processed wafers 200 are discharged from the boat 217 (wafer discharging).

(3) Effects of the Embodiments

According to the embodiments, one or more effects set forth below may be achieved.

(a) By performing Steps A to C, it is possible to selectively form the TiN film on the surface of the base 200*a* of the bases 200*a* to 200*c* exposed on the surface of the wafer 200. This makes it possible to simplify those steps, such as omitting a patterning process including photolithography, for example when manufacturing a semiconductor device. As a result, it is possible to improve a productivity of the semiconductor device and reduce the manufacturing costs.

(b) In Step A, it is possible to adsorb DMATMS on the surfaces of the bases 200*b* and 200*c* and make the adsorption state of DMATMS on the surface of the bases 200*c* be a stable chemical adsorption. Further, by performing Step B after performing Step A, it is possible to shift the adsorption state of DMATMS on the surface of the base 200*b* from an unstable physical adsorption state to a stable chemical adsorption state. As a result, according to the embodiments, it is possible to suppress the formation of the TiN film on the surfaces of the two types of bases (the bases 200*b* and 200*c*) by using one type of adsorption suppressor. As a result, it is possible to simplify the manufacturing process of the semiconductor device, improve the productivity, and reduce the manufacturing costs.

(c) In Step A, it is possible to make the amount of DMATMS selectively adsorbed on the bases 200*b* and 200*c* substantially uniform over the entire surface of the bases 200*b* and 200*c*. As a result, in Step C, it is possible to substantially uniformly and reliably inhibit the formation of the TiN film on the bases 200*b* and 200*c* over the entire surface thereof. That is, it is possible to enhance the selectivity in selective growth.

(d) Since at least one selected from the group of Steps A to C, specifically each of Steps A to C, is performed under a non-plasma atmosphere, plasma damage to the wafer 200 may be avoided, which makes it possible to apply the aforementioned method to a process where plasma damage is concerned about.

(e) The above-described effects may be obtained in the same manner even when an adsorption suppressor other than the DMATMS gas is used, when a precursor gas other than the $TiCl_4$ gas is used, when a reaction gas other than the $NH_3$ gas is used, or when an inert gas other than the $N_2$ gas is used.

Other Embodiments of the Present Disclosure

The embodiments of the present disclosure have been described above in detail. However, the present disclosure is not limited to the above-described embodiment, but may be differently modified without departing from the gist of the present disclosure.

For example, the metal element-containing film constituting the base 200*a* may be a conductive metal element-containing film such as a tungsten nitride film (WN film) or a titanium nitride film (TiN film) in addition to the W film. Even in these cases, the same effects as the above-described embodiments may be obtained. That is, it is possible to selectively form a film on the surface of the base 200*a* while avoiding film formation on the surfaces of the bases 200*b* and 200*c*.

Further, for example, in Step C, before starting the cycle that non-simultaneously performs Steps C1 and C2, it may be possible to perform a step ($NH_3$ pre-flow) of supplying a $NH_3$ gas for a predetermined time to the wafer 200 in the process chamber 201, that is, the wafer 200 after DMATMS is selectively adsorbed on the surfaces of the bases 200*b* and 200*c* of the bases 200*a* to 200*c*. Even in this case, after step B is performed, since DMATMS existing on the surfaces of the bases 200*b* and 200*c* is stably maintained without being desorbed, the same effects as those in the above-described embodiments may be obtained. Further, since the adsorption site on the surface of the base 200*a* may be optimized, it is possible to improve the quality of a film formed on the base 200*a*.

Further, for example, in Step C, as the precursor gas, in addition to the above-mentioned metal halide gas such as the $TiCl_4$ gas, it may be possible to use an organic metal gas such as a trimethylaluminum ($Al(CH_3)_3$, abbreviation: TMA) gas, a halosilane-based gas such as a dichlorosilane ($SiH_2Cl_2$, abbreviation: DCS) gas, a tetrachlorosilane ($SiCl_4$, abbreviation: 4CS) gas, or a hexachlorodisilane ($Si_2Cl_6$, abbreviation: HCDS) gas, or an aminosilane-based gas such as a trisdimethylaminosilane ($Si[N(CH_3)_2]_3H$, abbreviation: 3DMAS) gas.

Further, for example, as the reaction gas, in addition to the N-containing gas such as the $NH_3$ gas, it may be possible to use an O-containing gas such as an oxygen ($O_2$) gas or an ozone ($O_3$) gas, a N- and C-containing gas such as a triethylamine ($(C_2H_5)_3N$, abbreviation: TEA) gas, a C-containing gas such as a propylene ($C_3H_6$) gas, or a boron (B)-containing gas such as a trichloroborane ($BCl_3$) gas.

Then, according to gas supply sequences shown below, a film such as a titanium aluminum nitride film (TiAlN film), a titanium oxynitride film (TiON film), a titanium oxide film (TiO film), a SiN film, a silicon oxynitride film (SiON film), a silicon boronitride film (SiBN film), a silicon borocarbonitride film (SiBCN film), a silicon carbonitride film (SiCN film), a silicon oxycarbonitride film (SiOCN film), a silicon oxycarbide film (SiOC film), or a SiO film may be formed on the surface of the base 200a of the bases 200a to 200c. Even in these cases, the same effects as those in the above-described embodiments may be obtained.

$$DMATMS \rightarrow ANL \rightarrow (TiCl_4 \rightarrow TMA \rightarrow NH_3) \times n \Rightarrow TiAlN$$

$$DMATMS \rightarrow ANL \rightarrow (TiCl_4 \rightarrow NH_3 \rightarrow O_2) \times n \Rightarrow TiON$$

$$DMATMS \rightarrow ANL \rightarrow (TiCl_4 \rightarrow O_3) \times n \Rightarrow TiO$$

$$DMATMS \rightarrow ANL \rightarrow (4CS \rightarrow NH_3) \times n \Rightarrow SiN$$

$$DMATMS \rightarrow ANL \rightarrow (4CS \rightarrow NH_3 \rightarrow O_2) \times n \Rightarrow SiON$$

$$DMATMS \rightarrow ANL \rightarrow (DCS \rightarrow BCl_3 \rightarrow NH_3) \times n \Rightarrow SiBN$$

$$DMATMS \rightarrow ANL \rightarrow (DCS \rightarrow C_3H_6 \rightarrow BCl_3 \rightarrow NH_3) \times n \Rightarrow SiBCN$$

$$DMATMS \rightarrow ANL \rightarrow (HCDS \rightarrow C_3H_6 \rightarrow NH_3) \times n \Rightarrow SiCN$$

$$DMATMS \rightarrow ANL \rightarrow (HCDS\ C_3H_6 \rightarrow NH_3 \rightarrow O_2) \times n \Rightarrow SiOCN$$

$$DMATMS \rightarrow ANL \rightarrow (HCDS \rightarrow TEA \rightarrow O_2) \times n \Rightarrow SiOC$$
(N)

$$DMATMS \rightarrow ANL \rightarrow (3DMAS \rightarrow O_3) \times n \Rightarrow SiO$$

Recipes used in each process may be provided individually according to the processing contents and may be stored in the memory 121c via a telecommunication line or the external memory 123. Moreover, at the beginning of each process, the CPU 121a may properly select an appropriate recipe from the recipes stored in the memory 121c according to the processing contents. Thus, it is possible for a single substrate processing apparatus to form films of various types, composition ratios, qualities, and thicknesses with enhanced reproducibility. Further, it is possible to reduce an operator's burden and to quickly start each process while avoiding an operation error.

The recipes mentioned above are not limited to newly-provided ones but may be provided, for example, by modifying the existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

The example in which a film is formed by using a batch-type substrate processing apparatus capable of processing a plurality of substrates at a time has been described in the above-described embodiments. The present disclosure is not limited to the above embodiments, but may be suitably applied, for example, to a case where a film is formed by using a single-wafer type substrate processing apparatus capable of processing a single substrate or several substrates at a time. In addition, the example in which a film is formed by using a substrate processing apparatus including a hot-wall-type process furnace has been described in the above-described embodiments. The present disclosure is not limited to the above-described embodiments, but may be suitably applied to a case where a film is formed by using a substrate processing apparatus including a cold-wall-type process furnace.

Even in the case of using these substrate processing apparatuses, each process may be performed according to the same processing procedures and process conditions as those in the above-described embodiments, and the same effects as those in the above-described embodiments may be achieved.

The above-described embodiments may be used in proper combination. The processing procedures and process conditions used in this case may be the same as, for example, the processing procedures and process conditions of the above-described embodiments.

EXAMPLES

A plurality of wafers having surfaces on which a W film (first base), a SiN film (second base), and a SiO film (third base) exposed respectively are provided, a natural oxide film formed on the surface of each base in each wafer is removed by washing the surface of each wafer for 1 minute with a 1% HF aqueous solution, and then by using the substrate processing apparatus shown in FIG. 1, a TiN film is formed on each wafer with four different methods to provide four evaluation samples (Samples 1 to 4).

When providing Sample 1 (Comparative Example), Steps A and B in the above-described embodiments are not performed, and Step C is performed. The process conditions in Step C are set as predetermined conditions within the process condition range described in the above-described embodiments.

When providing Sample 2 (Comparative Example), Step A in the above-described embodiments is performed, Step B is not performed, and Step C is performed. The process conditions in Step A are set as predetermined conditions within the process condition range described in the above-described embodiments. The process conditions in step C are the same as the process conditions in Step C when providing Sample 1.

When providing Sample 3 (Example), Steps A, B, and C in the above-described embodiments are performed, respectively. The process conditions in Step A are the same as the process conditions in Step A when providing Sample 2. The process conditions in Step B are set as predetermined conditions within the process condition range described in the above-described embodiments. The process conditions in step C are the same as the process condition in Step C when providing Sample 1.

When providing Sample 4 (Comparative Example), Steps A, B, and C in the above-described embodiments are performed, respectively. The processing temperature (first temperature) in Step A is set as a predetermined temperature within the range of 400 to 600 degrees C., which is about the same as the processing temperature (second temperature) in Step B. Other processing conditions are the same as the processing conditions used when providing Sample 3.

Then, the thicknesses of the TiN film formed on the surfaces of the first to third bases of each of Samples 1 to 4 are measured. The results are shown in FIGS. 6A to 6D. In these figures, the vertical axis represents the film thickness (nm) of the TiN film formed on the surface of each base, and the horizontal axis represents the types of bases (the third base (SiO film), the second base (SiN film), and the first base (W film) in order from the left), respectively.

Figures 6A, 6B:
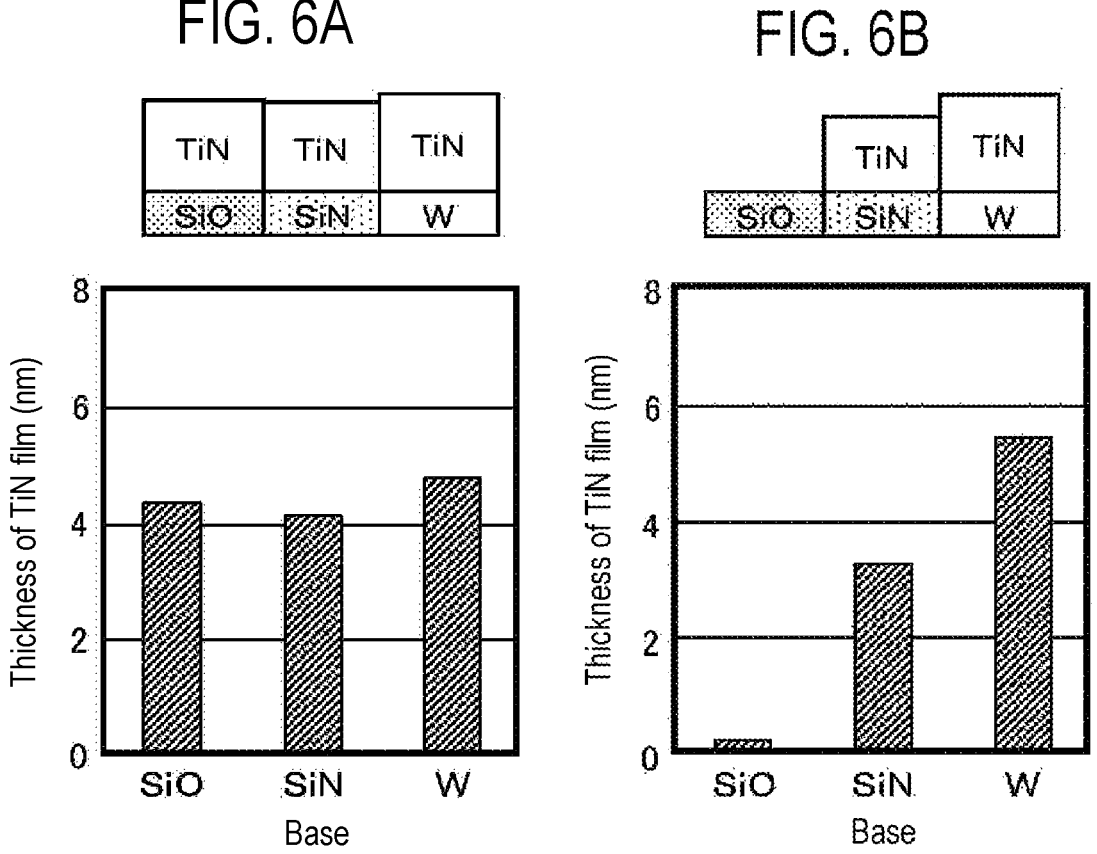

As shown in FIG. 6A, in Sample 1 where Steps A and B are not performed, it is confirmed that TiN films having about the same thickness are formed on the surfaces of the first to third bases, respectively, and that sufficient selectivity is not obtained.

Further, as shown in FIG. 6B, in Sample 2 where Step A is performed and Step B is not performed, it is confirmed that the TiN film is properly formed on the surface of the first base (W film), and formation of the TiN film on the surface of the third base (SiO film) may be suppressed, but the TiN film having a certain thickness is formed on the surface of the second base (SiN film), and that sufficient selectivity is not obtained for a plurality of types of bases.

Figures 6C, 6D:
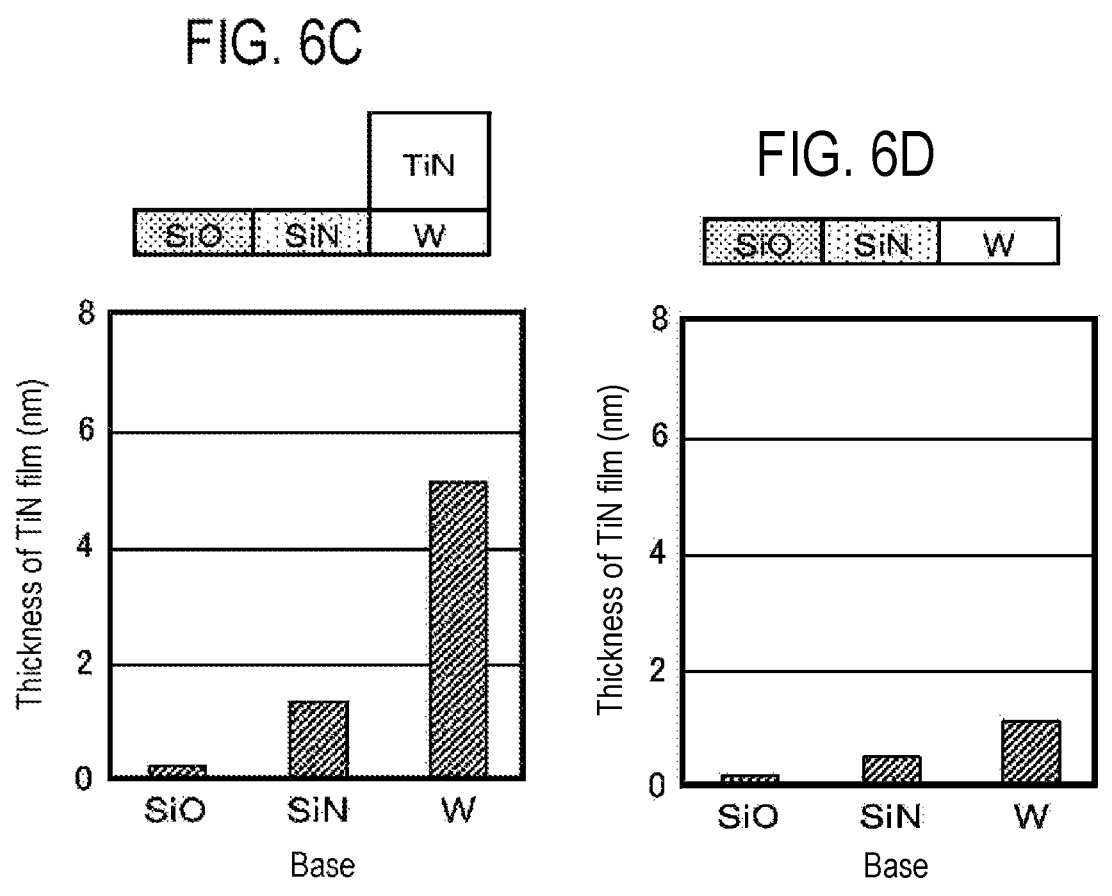

Further, as shown in FIG. 6C, in Sample 3 where both Steps A and B are performed, it is confirmed that the TiN film is properly formed on the surface of the first base (W film), and formation of the TiN films on the surfaces of the second base (SiN film) and the third base (SiO film) is suppressed, and that sufficient selectivity is obtained for a plurality of types of bases. Further, it can be seen that the thickness of the TiN film formed on the surface of the second base (SiN film) is about 1 nm, and the thickness of the TiN film to be formed on the surface of the second base (SiN film) may be reduced to zero by reducing the number of cycles in Step C.

Further, as shown in FIG. 6D, in Sample 4 where both Steps A and B are performed and, at that time, the processing temperature (first temperature) of Step A is the same as the processing temperature (second temperature) of Step B, it is confirmed that formation of the TiN film is suppressed on all the surfaces of the first to third bases. It is presumed that this is because the thermal energy given to the reaction system when Step A is performed exceeds the activation energy when DMATMS is chemically adsorbed on the surfaces such that DMATMS is chemically adsorbed on all the surfaces of the first to third bases without selectivity by setting the processing temperature of Step A to be equal to the processing temperature of step B, or because DMATMS is gas-phase decomposed such that the constituent components and constituent elements (Si, an amino group, and a methyl group, or elements such as N, C, and H that constitute them) of DMATMS are multi-deposited on all the surfaces of the first to third bases.

It can be seen from the above results that the processing temperature (first temperature) in Step A may have to be lower than the processing temperature (second temperature) in Step B to selectively adsorb DMATMS on the surfaces of the second base (SiN film) and the third base (SiO film) and prevent DMATMS from being adsorbed on the surface of the first base (W film) in Step A. Further, it can be seen that Step B of thermally annealing the wafer at the second temperature higher than the first temperature may have to be performed after performing Step A at the first temperature to change the adsorption state of DMATMS on the surface of the second base to a stable adsorption state. Further, it can be seen that, even when step B is performed under the second temperature higher than the first temperature, the stable adsorption state of DMATMS on the surface of the third base is maintained without being changed.

According to the present disclosure in some embodiments, it is possible to simplify a process of manufacturing a semiconductor device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of selectively forming a film, comprising:
   (a) supplying an adsorption suppressor to a substrate, whose surface has a first base and a second base, under a first temperature of 80 degrees Celsius or higher to adsorb the adsorption suppressor on a surface of one of the first base and the second base;
   (b) annealing the substrate under a second temperature higher than the first temperature after adsorbing the adsorption suppressor on the surface of the one base; and
   (c) forming a film on a surface of the other of the first base and the second base, which is different from the one of the first base and the second base, by supplying a film-forming gas to the annealed substrate under a third temperature lower than the second temperature,
   wherein the surface of the substrate further has a third base,
   wherein in (a), the adsorption suppressor is adsorbed on a surface of the third base, and
   wherein the first base includes a conductive metal element-containing film, the second base includes a nitride film, and the third base includes an oxide film.

2. The method of claim 1, where in (a), the adsorption suppressor is adsorbed on the surface of the one of the first base and the second base while the adsorption suppressor is suppressed from being adsorbed on the surface of the other of the first base and the second base.

3. The method of claim 1, wherein (a) is performed under a condition that the adsorption suppressor does not undergo gas phase decomposition.

4. The method of claim 1, wherein an adsorption state of the adsorption suppressor adsorbed on the surface of the one of the first base and the second base in (a) includes physical adsorption.

5. The method of claim 4, wherein in (b), the adsorption state of the adsorption suppressor adsorbed on the surface of the one of the first base and the second base is shifted to chemical adsorption.

6. The method of claim 1, wherein in (b), an adsorption state of the adsorption suppressor adsorbed on the surface of the one of the first base and the second base is changed to an adsorption state more stable than the adsorption state of the adsorption suppressor adsorbed on the surface of the one of the first base and the second base in (a).

7. The method of claim 1, wherein in (c), the film is formed on the surface of the other of the first base and the second base while the film is not formed on the surface of the one of the first base and the second base.

8. The method of claim 1, wherein an adsorption state of the adsorption suppressor adsorbed on the surface of the third base in (a) includes chemical adsorption.

9. The method of claim 1, wherein an adsorption state of the adsorption suppressor adsorbed on the surface of the third base in (a) is more stable than an adsorption state of the adsorption suppressor adsorbed on the surface of the one of the first base and the second base in (a).

10. The method of claim 1, wherein in (c), the film is formed on the surface of the other of the first base and the second base while the film is not formed on the surface of the one of the first base and the second base and not formed on the surface of the third base.

11. The method of claim 1, wherein the first base includes an oxygen-free and metal element-containing film, the second base includes an oxygen-free and semi-metal element-containing film, and the third base includes an oxygen-containing film.

12. The method of claim 1, wherein the first base includes a transition metal-containing film, the second base includes a silicon- and nitrogen-containing film, and the third base includes a silicon- and oxygen-containing film.

13. The method of claim 11, wherein the one of the first base and the second base is the second base, and the other of the first base and the second base is the first base.

14. The method of claim 1, wherein the first base includes an oxygen-free and metal element-containing film, and the second base includes an oxygen-free and semi-metal element-containing film.

15. The method of claim 14, wherein the one of the first base and the second base is the second base, and the other of the first base and the second base is the first base.

16. The method of claim 1, wherein at least one selected from the group of (a), (b), and (c) is performed under a non-plasma atmosphere.

* * * * *